(12) United States Patent
Le Royer et al.

(10) Patent No.: US 9,276,102 B2
(45) Date of Patent: Mar. 1, 2016

(54) TUNNEL TRANSISTOR WITH HIGH CURRENT BY BIPOLAR AMPLIFICATION

(71) Applicants: COMMISSARIAT A L'ENERGIE ATOMIQUE ET AUX ENE ALT, Paris (FR); CENTRE NATIONAL DE LA RECHERCHE SCIENTIFIQUE, Paris (FR)

(72) Inventors: Cyrille Le Royer, Tullins-Fures (FR); Sorin Cristoloveanu, Seyssinet Pariset (FR); Jing Wan, Grenoble (FR); Alexander Zaslavsky, Providence, RI (US)

(73) Assignees: Commissariat àl'énergie atomique et aux énergies alternatives, Paris (FR); CENTRE NATIONAL DE LA RECHERCHE SCIENTIFIQUE, Paris (FR)

( * ) Notice: Subject to any disclaimer, the term of this patent is extended or adjusted under 35 U.S.C. 154(b) by 0 days.

(21) Appl. No.: 13/936,502

(22) Filed: Jul. 8, 2013

(65) Prior Publication Data

US 2014/0015009 A1    Jan. 16, 2014

(30) Foreign Application Priority Data

Jul. 11, 2012  (FR) .................................. 12 56686

(51) Int. Cl.
*H01L 29/66* (2006.01)
*H01L 29/78* (2006.01)
*H01L 29/73* (2006.01)
*H01L 29/739* (2006.01)
*H01L 29/165* (2006.01)

(52) U.S. Cl.
CPC .......... *H01L 29/78* (2013.01); *H01L 29/66227* (2013.01); *H01L 29/66356* (2013.01); *H01L 29/66477* (2013.01); *H01L 29/7302* (2013.01); *H01L 29/739* (2013.01); *H01L 29/7391* (2013.01); *H01L 29/165* (2013.01)

(58) Field of Classification Search
CPC ...................................................... H01L 29/78
USPC ............ 257/192, E21.403, E29.262; 438/156
See application file for complete search history.

(56) References Cited

U.S. PATENT DOCUMENTS 5,489,792 A * 2/1996 Hu et al. ........................ 257/347
2011/0303950 A1 * 12/2011 Lauer et al. .................... 257/192

OTHER PUBLICATIONS

F. Mayer, et al., "Impact of SOI,Si$_{1-x}$Ge$_x$OI and GeOI Substrates on CMOS compatible Tunnel FET performance", Tech. Dig.Int. Electron Devices Meet., 2008, 4 pages.

Tejas Krishnamohan, et al., "Double-Gate Strained-Ge Heterostructure Tunneling FET (TFET) With Record High Drive Currents and <60mV/dec Subthreshold Slope", Tech. Dig. Int. Electron Devices Meet., 2008, pp. 947-949.

(Continued)

*Primary Examiner* — Matthew Gordon
(74) *Attorney, Agent, or Firm* — Oblon, McClelland, Maier & Neustadt, L.L.P.

(57) ABSTRACT

A tunnel-effect transistor the drain region of which includes a first zone doped with a doping of a first type, and a second zone doped with a doping of a second type forming a junction with the first zone.

18 Claims, 14 Drawing Sheets

(56) References Cited

OTHER PUBLICATIONS

J. Wan, et al., "Tunneling FETs on SOI: Suppression of ambipolar leakage, low-frequency noise behavior, and modeling", Solid-State Electronics, 65-66, 2011, pp. 226-233.

A. Zaslavsky, et al., "Multi-emitter Si/Ge$_x$Si$_{1-x}$ Heterojunction Bipolar Transistor with No Base Contact and Enhanced Logic Functionality", IEEE Electron Device Letters, vol. 18, No. 9, Sep. 1997, pp. 453-455.

French Preliminary Search Report issued Apr. 25, 2013, in French Application No. 12 56686 filed Jul. 11, 2012 (with English Translation of Categories of Cited Documents).

Jing Wan, et al., "SOI TFETs: Suppression of Ambipolar Leakage and Low-Frequency Noise Behavior", Proceedings of the 40$^{th}$ European Solid-State Device Research Conference (ESSDERC 2010), Sep. 14, 2010, 4 pgs.

Krishna Kumar Bhuwalka, et al., "Vertical Tunnel Field-Effect Transistor", IEEE Transactions on Electron Devices, vol. 51, No. 2, Feb. 2, 2004, 4 pgs.

U.S. Appl. No. 14/791,713, filed Jul. 6, 2015, Reboh, et al.

* cited by examiner

Background Art

TUNNEL TRANSISTOR WITH HIGH CURRENT BY BIPOLAR AMPLIFICATION

TECHNICAL FIELD

The invention relates to the field of microelectronics, and that of transistors, and in particular that of tunnel-effect transistors.

It provides for use of a transistor structure with an improved tunnel effect.

PRIOR ART

Figure 1:
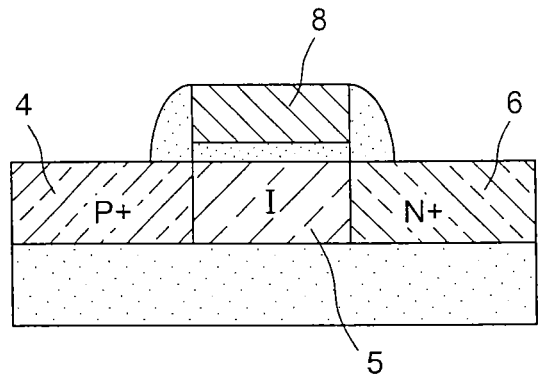

FIG. 1 illustrates a tunnel transistor device or TFET (Tunnel Field Effect Transistor) according to the prior art. Its structure is similar to that of a conventional MOSFET transistor, but this transistor has, either side of its gate electrode 8, a P+ doped zone 4, and an N+ doped zone 6, where doped zones 4 and 6 are separated by a undoped semiconductor zone 5 forming a channel region, whereas doped zones 4 and 6 can play the role of source or drain region, depending on how they are biased. Doped zones 4 and 6 and undoped semiconductor zone 5 form a PIN-type diode controlled by gate electrode 8.

The transistor may be designed to operate as a P-type transistor, the P+ doped region in this case being used as the drain region, and biased with a negative potential, whereas the N+ doped region is used as the source region and earth.

When the transistor is designed to operate as an N-type transistor an opposite biasing configuration is used. The P+ doped region is used as the source region, and may be earthed, whereas the N+ doped region is used as the drain region and biased with a positive potential.

Figure 2A:
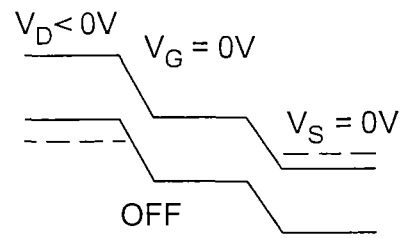
Figure 2B:
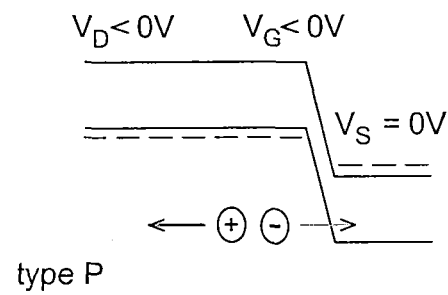
Figure 2C:
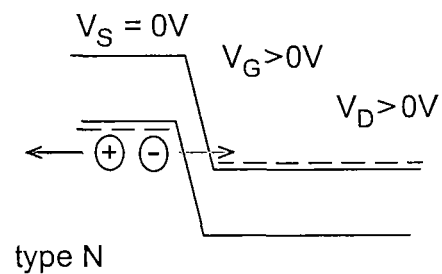

FIGS. 2A, 2B, 2C represent band diagrams, respectively, of a tunnel-effect transistor biased so as to be put in the off-state, of a P-type tunnel-effect transistor put in the on-state, and of an N-type tunnel-effect transistor put in the on-state.

Tunnel-effect transistors are particularly advantageous for applications requiring rapid switching, and using low power consumption.

Tunnel-effect transistors also undergo effects known as "short channel" effects less than MOS transistors.

Such a transistor type may, however, pose leakage current problems.

Figure 3:
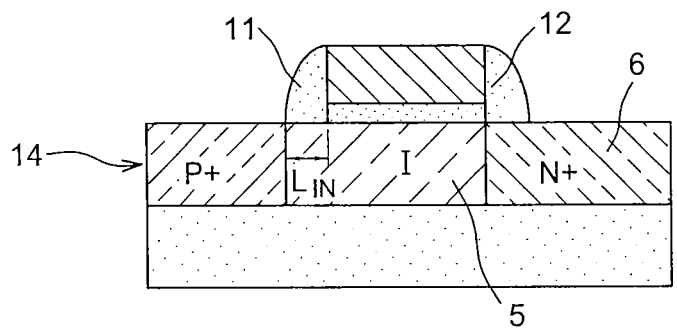

To resolve such a problem a variant architecture such as the one illustrated in FIG. 3 may be used.

In this variant the TFET transistor includes an N+ doped zone 6 and another P+ doped zone 14, positioned either side of gate 8, in an asymmetrical manner relative to the latter.

N+ doped zone 6 extends under a spacer 12 formed against gate 8 of the transistor, and is separated from P+ doped zone 14 by a undoped semiconductor zone 5. P+ doped zone 14 does not extend under the other insulating spacer 11 formed against gate 8, and undoped semiconductor zone 5 includes a portion of length $L_{in}$ under this other insulating spacer 11.

When P+ doped zone 14 forms a drain region, the fact that the undoped zone is positioned under spacer 11 enables the leakage currents to be reduced in the drain.

With such a structure current level $I_{ON}$ in the on-state remains lower than the one obtained with a conventional MOS transistor.

The problem of finding a new transistor structure having the advantages of a TFET-type structure, whilst having a higher current level $I_{ON}$ in the on-state, is posed.

DESCRIPTION OF THE INVENTION

The present invention relates to a device having a tunnel-effect transistor or TFET which has an electrode formed of a junction.

The present invention relates to a transistor, in particular a tunnel-effect transistor, having source and drain regions, together with at least one gate, where a given region among said source and drain regions includes a first zone doped with a doping of a first type, where said region also has a second zone doped with a doping of a second type, and forming a junction with said first doped zone.

Doping of different types is understood to mean that the doping of the first type consists of using an excess of a first type of charge carriers, for example electrons (doping of the N or N+ type), whereas the doping of the second type consists in using an excess of a second type of charge carriers, for example holes (doping of the P or P+ type).

The first zone may be, for example, N+ doped, whereas the second zone may be P doped, so as to form an N+P junction.

The other region among the source and drain regions includes a third zone doped with a doping of a type different from that of said second doped zone. The first doped zone may be, for example, N+ doped. The third zone may thus be doped with a doping of the same type as that of the first doped zone.

Said first, second and third doped zones enable a bipolar amplification of current $I_{ON}$ of the transistor to be implemented.

The second doped zone and the third doped zone may be separated by a undoped semiconductor or weakly doped zone, in which there is a channel region of the transistor.

A weakly doped zone is understood to mean, throughout the present description, that the dopant concentration of this zone is at least less than $10^{17}$ cm$^{-3}$.

According to an advantageous implementation, the first doped zone and the second doped zone are superposed or stacked.

Advantageously, the transistor further includes: a first insulating spacer and a second insulating spacer positioned against the gate electrode.

The third doped zone may be positioned so as to have an extension under the second spacer, where said undoped or weakly doped semiconductor zone is, for its part, placed against said doped second zone, and extends opposite the gate, and also under the first spacer.

Such an architecture enables the leakage currents to be reduced.

According to one implementation possibility, said other region, among the source and drain regions, may include a fourth doped zone having a doping of a type different from that of said second zone and of the same type as that of the third doped zone, where the fourth doped zone is in contact with the third doped zone, and positioned opposite said channel region of the transistor and of said given region, where said undoped or weakly doped semiconductor zone separates said fourth doped zone from said second doped zone.

If the third doped zone belongs to a source region of the transistor, this fourth doped zone may act as a buried source zone.

Such an architecture may enable the resistance to the stream of majority carriers to be reduced.

The transistor may also be designed such that the first doped zone is made of a first semiconductor material, and such that the second doped zone is made of a second semiconductor material, where the second semiconductor material has a smaller gap than the first semiconductor material.

An heterojunction is formed in this manner, and enables a high current of majority carriers to be obtained, whilst maintaining a small current of minority carriers, producing a bipolar amplification of tunnel current.

The gate and the second doped zone may rest on a layer made of the second semiconductor material.

A small-gap semiconductor material may thus be chosen to form the channel region.

According to one variant architecture of the transistor, the first doped zone and the second doped zone are superposed, the source and drain regions also being superposed, where said other region includes, either side of the gate electrode, the third doped zone and a fourth zone doped with a doping of the same type as that of said third doped zone, and where the fourth doped zone and said third doped zone rest on an undoped or weakly doped semiconductor zone, and are separated from the second doped zone by this undoped or weakly doped semiconductor zone.

According to another variant architecture of the transistor, the first doped zone and the second doped zone are superposed, the drain and source regions also being superposed, where an undoped or weakly doped semiconductor zone rests on said second doped zone, and separates said second doped zone from said third doped zone, where said third doped zone rests on the undoped semiconductor zone, and where the gate electrode is positioned around a portion of said undoped semiconductor zone.

According to another variant architecture, the tunnel-effect transistor may be implemented with a double-gate structure.

According to this other variant of the transistor, the first doped zone and the second doped zone are superposed, the drain and source regions also being superposed, where an undoped or weakly doped semiconductor zone rests on said second doped zone and separates said second doped zone from said third doped zone, where said third doped zone rests on the undoped semiconductor zone, and where a first gate electrode is positioned against a first portion of said undoped semiconductor zone, whereas another gate electrode independent of said first gate electrode is positioned against a second portion of said undoped semiconductor zone located opposite the first portion.

The transistor may thus include two electrodes which are biased independently of one another.

This may enable a tunnel transistor with a very short gate length to be implemented.

The invention provides for a microelectronic device including one or more transistors as defined above.

The present invention further relates to a method of production of a transistor as defined above.

The present invention relates in particular to the method of producing a transistor including the following steps: formation of a given source or drain region including a zone doped with a doping of a first type resting on a second zone doped with a doping of a second type, and producing a junction with said first doped zone, and of another drain or source region, including a third zone doped with a doping of a type different from that of said second doped zone.

The method may further include: prior to the step of formation of said given region, the following steps:
 at least partial formation of a gate, followed by
  formation of the given region by deposition either side of the gate of a semiconductor layer doped with the doping of the first type, followed by deposition either side of the gate of another semiconductor layer doped with the doping of the second type.

The method may further include, after the step of formation of a given region, a step which consists in implanting locally on a single side of the gate, so as to modify the doping of said doped semiconductor layer and of said other doped semiconductor layer.

BRIEF DESCRIPTION OF THE ILLUSTRATIONS

Figure 4:
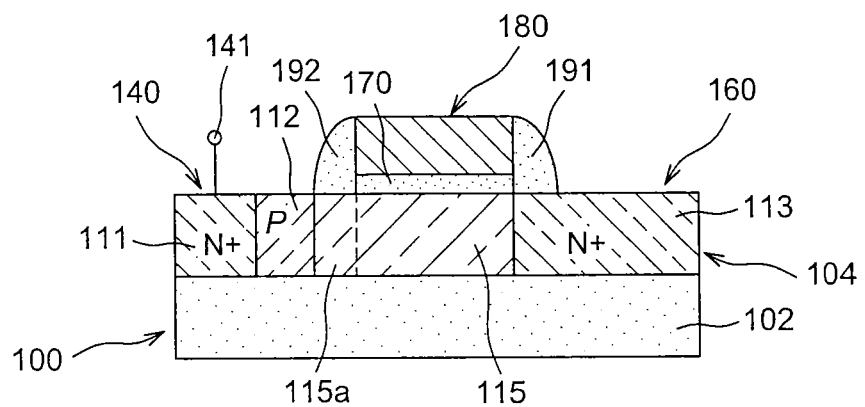
Figure 5:
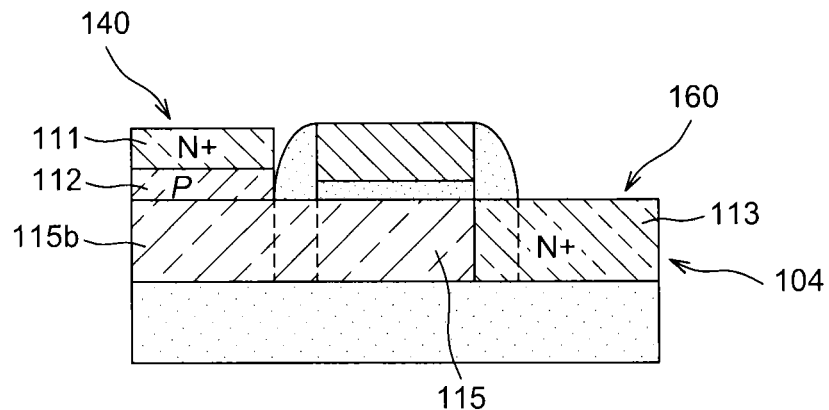
Figure 6:
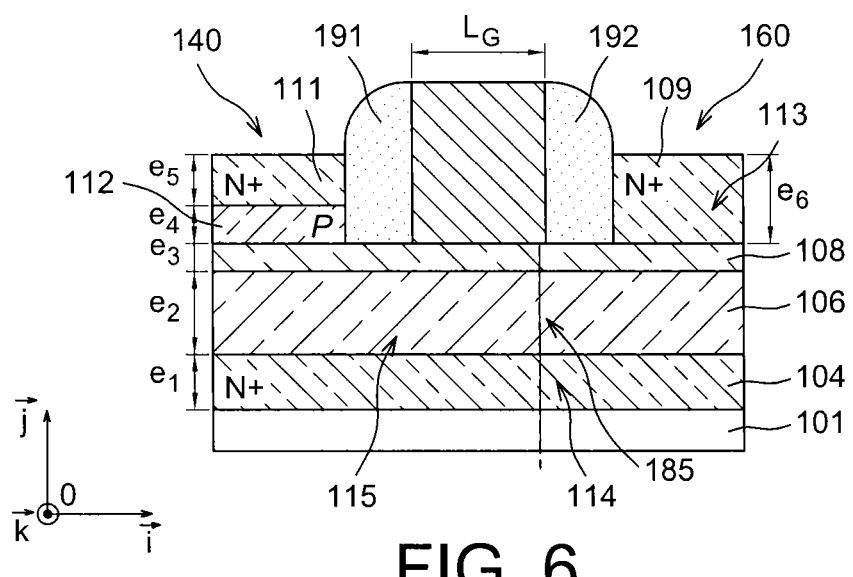
Figure 7A:
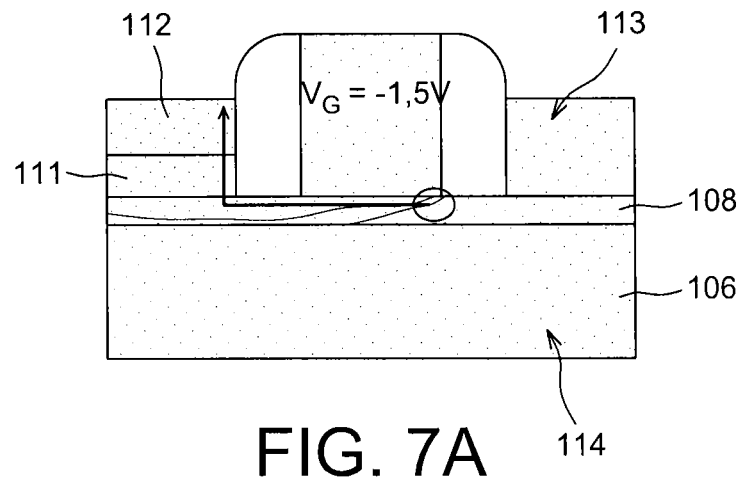
Figure 7B:
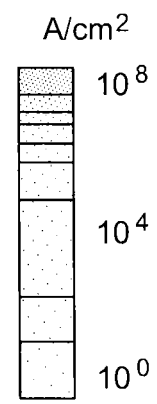
Figure 7B:
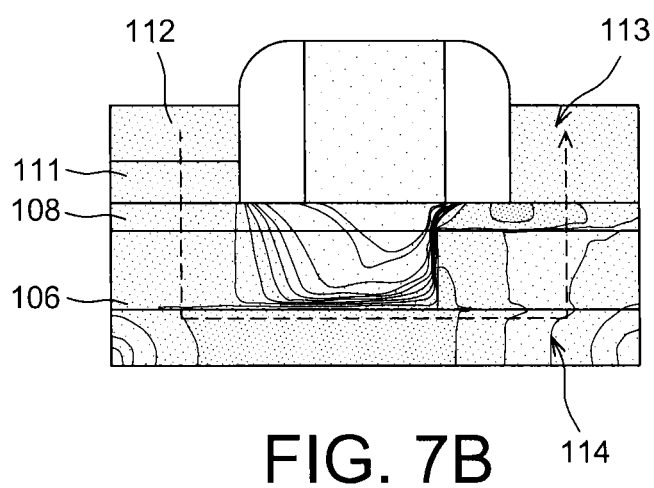
Figure 11:
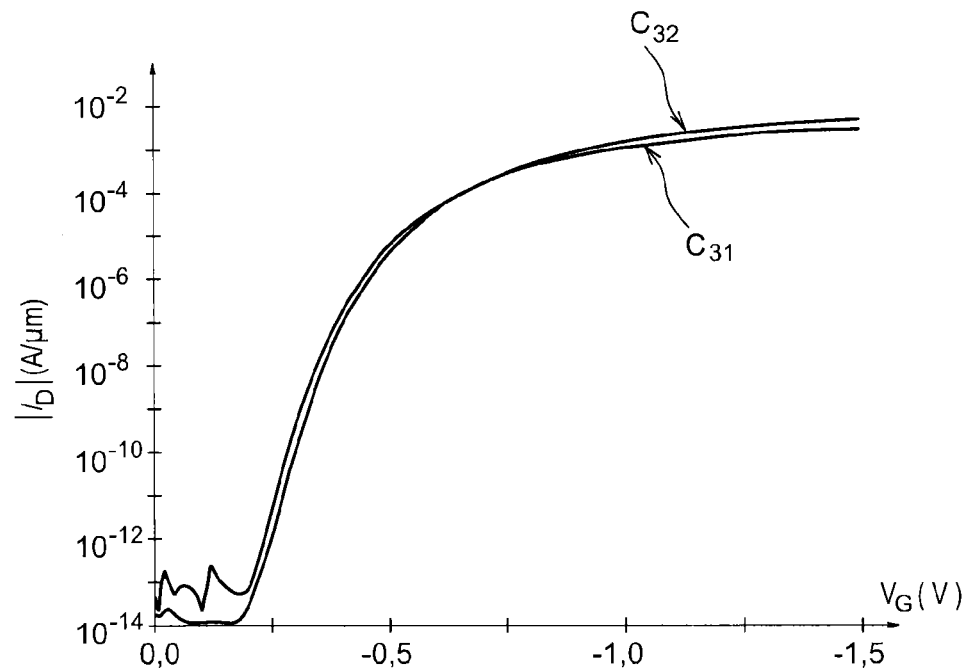
Figure 12A:
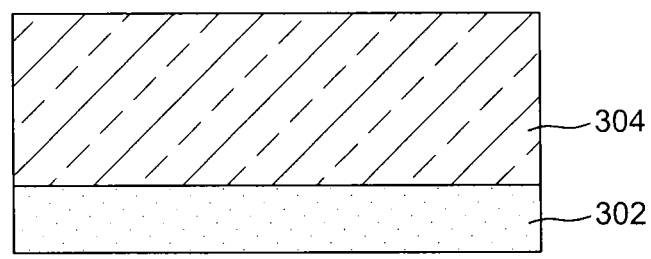
Figure 12B:
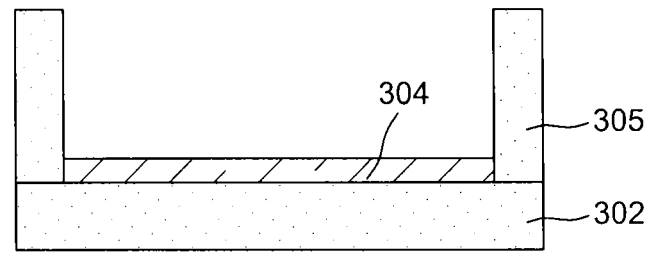
Figure 12C:
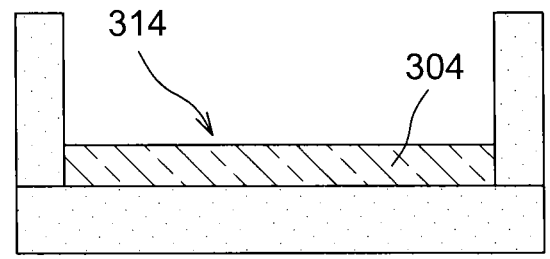
Figure 12D:
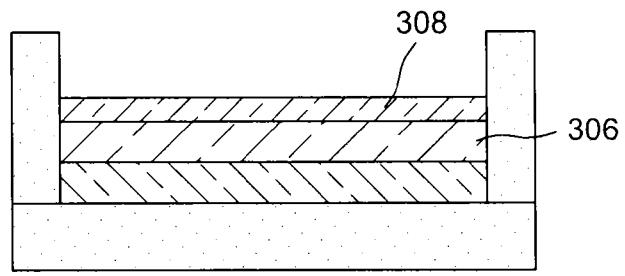
Figure 12E:
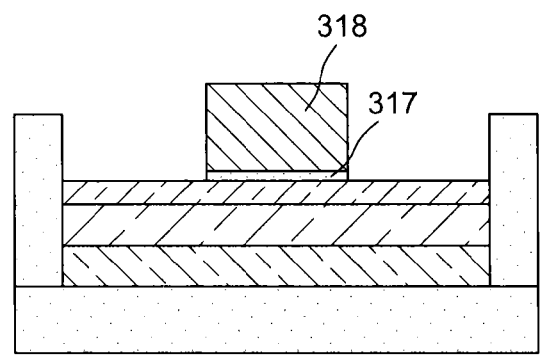
Figure 12F:
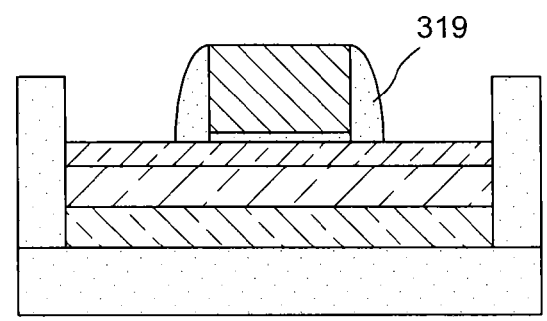
Figure 12G:
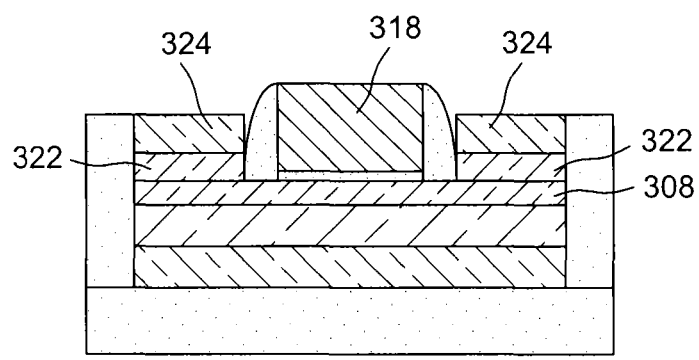
Figure 12H:
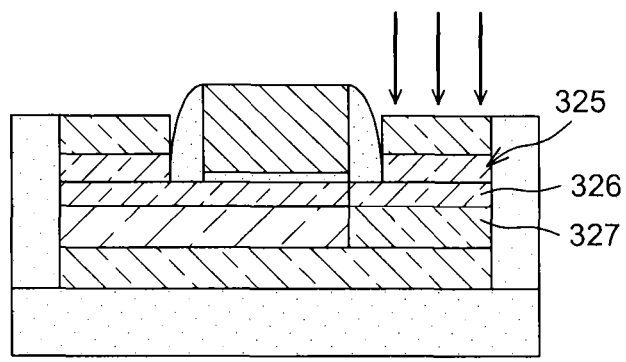
Figure 13:
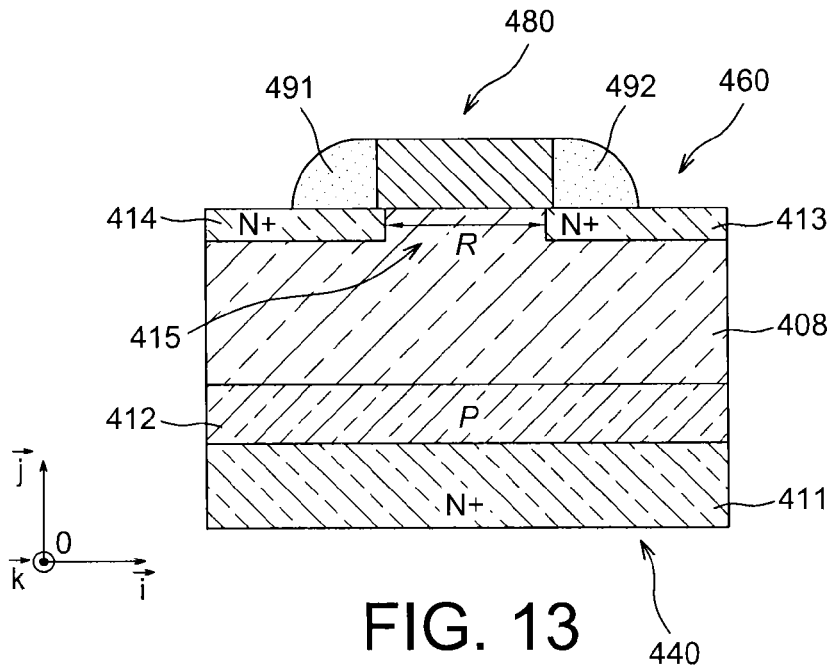
Figure 14:
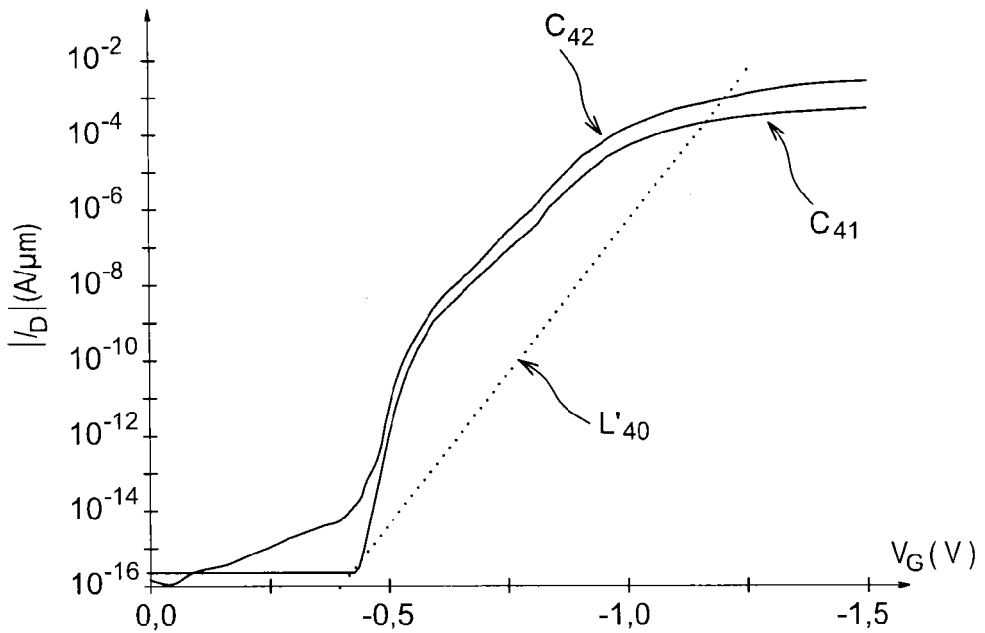
Figure 15A:
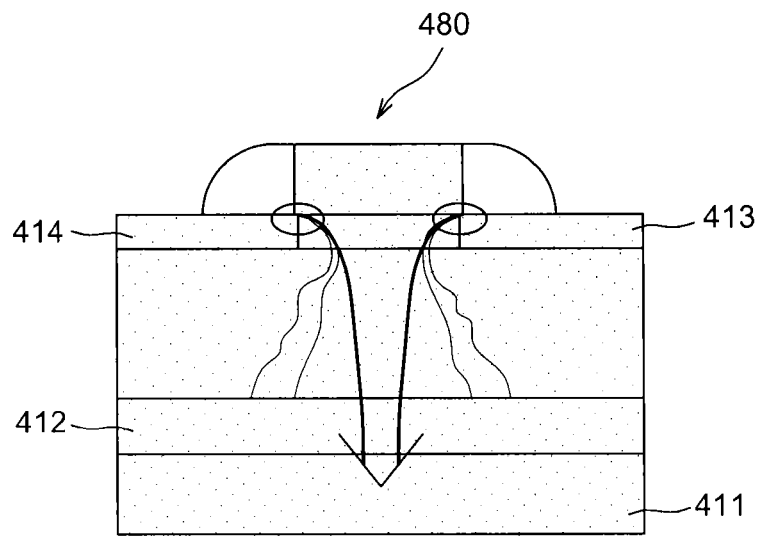
Figure 15B:
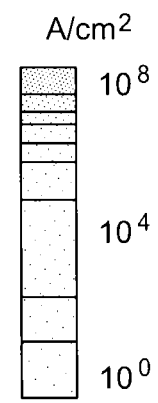
Figure 15B:
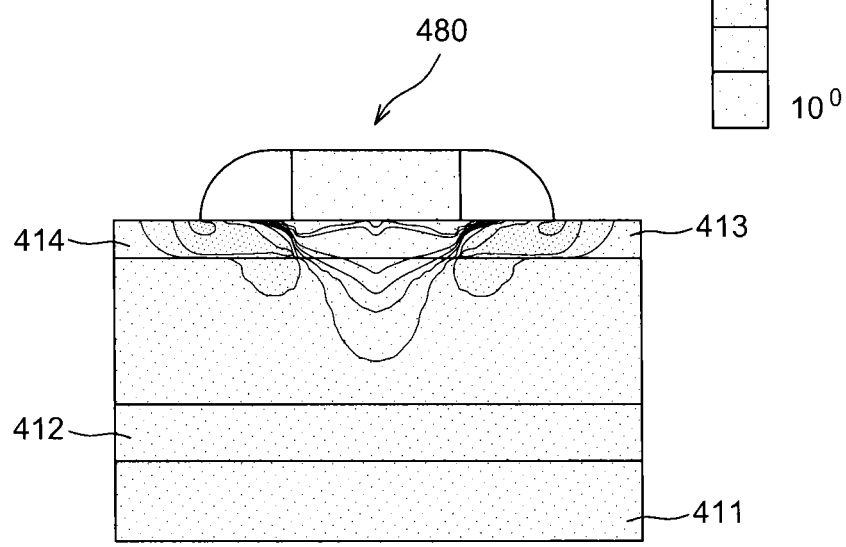
Figure 16:
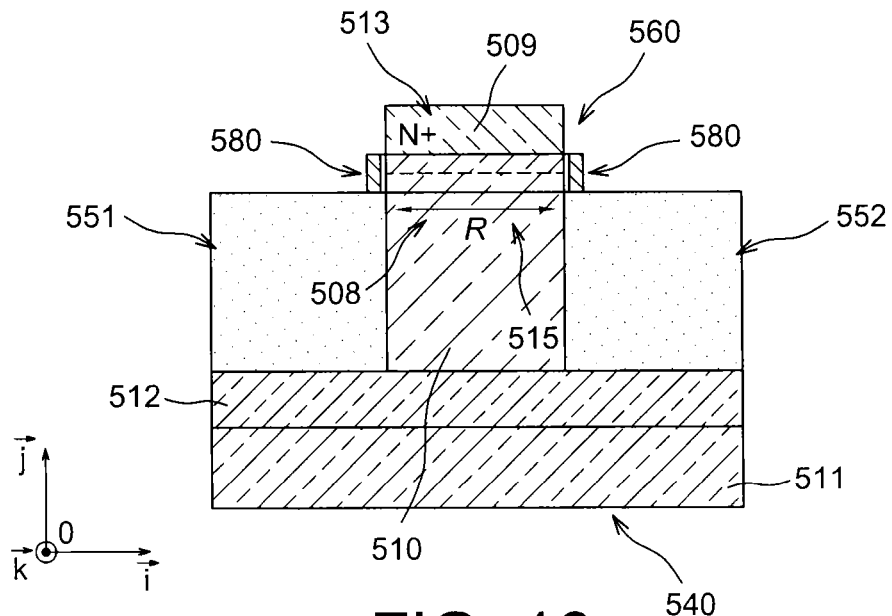
Figure 17:
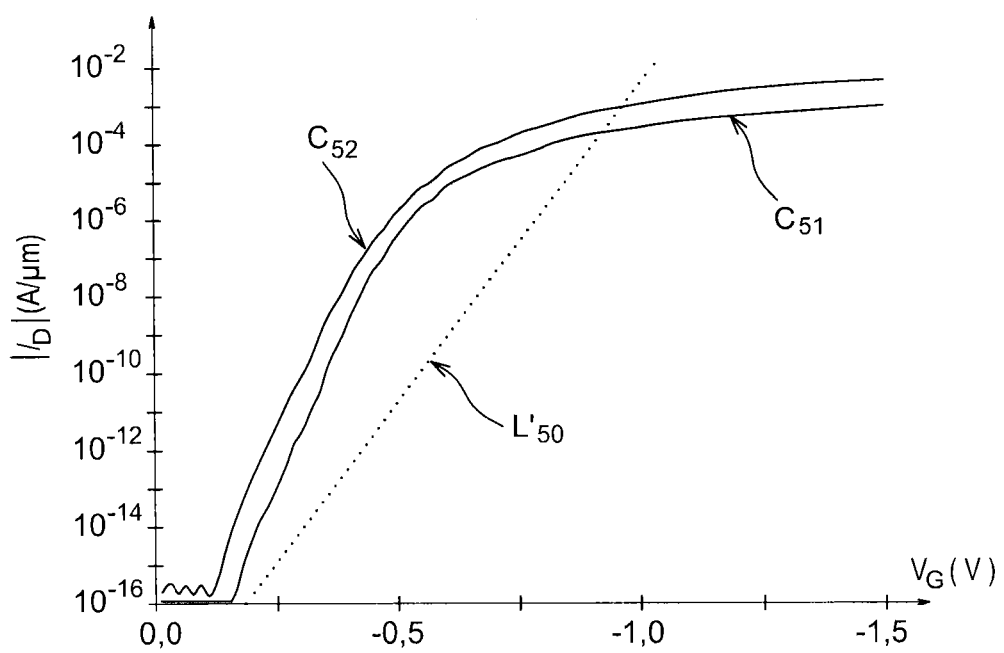
Figure 18A:
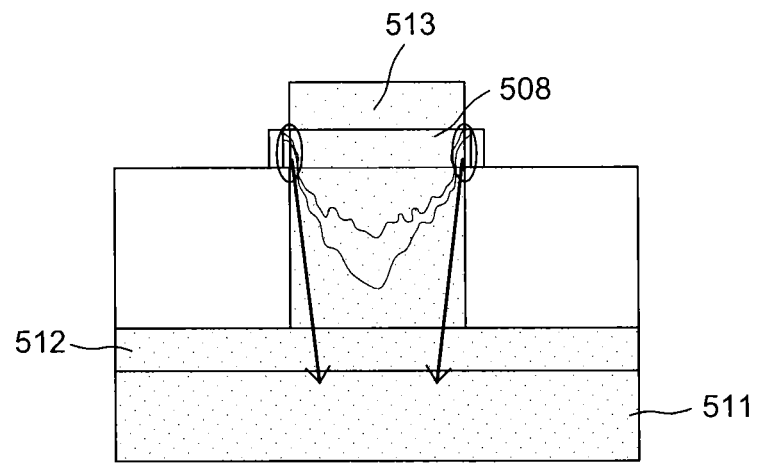
Figure 18B:
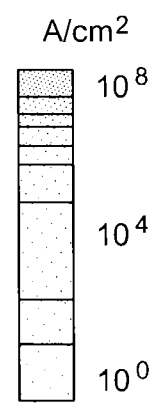
Figure 18B:
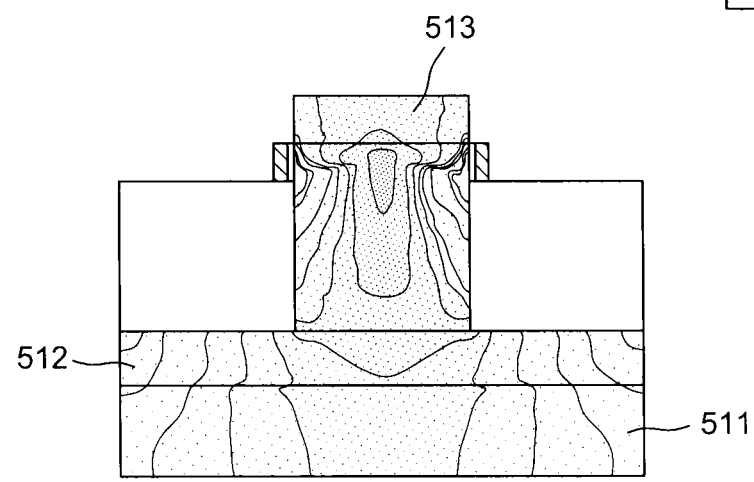
Figure 19:
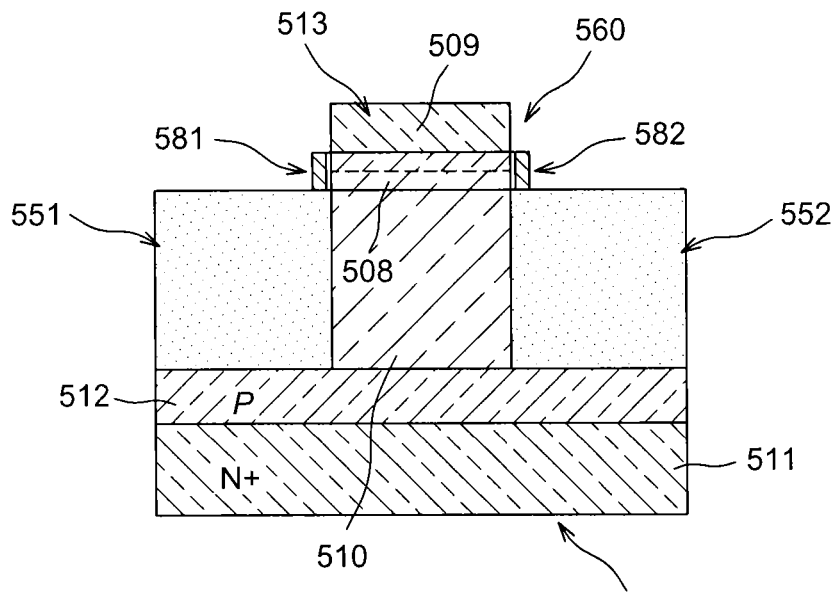
Figure 20:
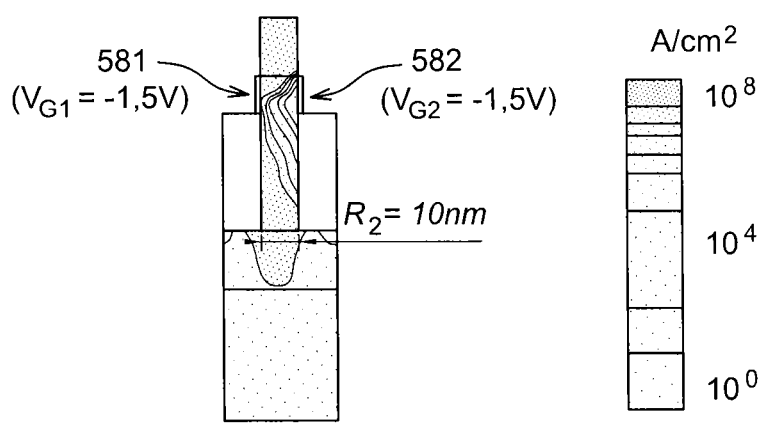

The present invention will be better understood on reading the description of example embodiments given, purely as an indication and in no sense restrictively, making reference to the appended illustrations in which:

FIG. 1 illustrates a tunnel-effect transistor structure,

FIGS. 2A, 2B, 2C represent band diagrams of a tunnel-effect transistor structure, FIG. 3 illustrates a variant tunnel-effect transistor structure, FIG. 4 illustrates a first example of a tunnel-effect transistor according to the invention, having a drain region including bracketed doped zones of different types, and forming a junction, FIG. 5 illustrates a second example of a tunnel-effect transistor structure according to the invention, having a drain region including superposed doped zones of different types, and forming a junction, FIG. 6 illustrates a third example of a tunnel-effect transistor structure according to the invention, having a drain region including superposed doped zones of different types and forming a junction, where the transistor further includes a buried source region passing under the channel region, and which extends opposite the drain region;

FIGS. 7A and 7B represent results of simulations of charge carrier density within a tunnel-effect transistor according to the invention, FIGS. 8, 9, 10, 11 illustrate electrical operating characteristics of tunnel-effect transistor(s) implemented according to the invention, FIGS. 12A-12H illustrate an example method of production of a tunnel-effect transistor according to the invention, FIG. 13 illustrates a fourth example of a tunnel-effect transistor with bipolar amplification according to the invention, having superposed source, channel and drain regions, where the drain region includes superposed doped zones of different types and forming a junction, FIG. 14 illustrates electrical operating characteristics of a tunnel-effect transistor of the type of the fourth example of tunnel-effect transistor according to the invention, FIGS. 15A and 15B represent results of simulations of charge carrier density within a tunnel-effect transistor of the type of the fourth example of tunnel-effect transistor according to the invention, FIG. 16 illustrates a fifth example of a TFET transistor having source, superposed channel and drain regions, where the drain region includes superposed doped zones of different types and forming a junction, FIG. 17 illustrates electrical operating characteristics of a tunnel-effect transistor of the type of said fifth example of tunnel-effect transistor, FIGS. 18A and 18B represent results of simulations of charge carrier density within a tunnel-effect transistor of the type of said fifth example of tunnel-effect transistor, FIG. 19 illustrates a sixth variant of a TFET transistor having a double-gate structure, FIG. 20 represents results of simulations of charge carrier density within such a tunnel-effect transistor structure of the type of said sixth example of transistor.

Identical, similar or equivalent portions of the various figures have the same numerical references, to make it easier to go from one figure to another.

The various portions represented in the figures are not necessarily represented at a uniform scale, in order to make the figures more readable.

DETAILED DESCRIPTION OF PARTICULAR EMBODIMENTS

A first example of a microelectronic device according to invention, including a tunnel-effect transistor formed on a substrate, will now be given in connection with FIG. 4.

Substrate 100 may be, for example, of the Semiconductor On Insulator type such as an SOI substrate and formed from a (unrepresented) semiconductor support layer made, for example, of silicon, covered with an insulating layer 102, for example made of $SiO_2$, which is itself covered by a layer 104 made of a semiconductor material such as, for example, silicon, and in which there is a channel zone of the transistor.

Opposite the channel zone a gate dielectric zone 170 and a gate electrode 180 formed on this dielectric zone 170 rest on semiconductor layer 104.

Drain region 140 and source region 160 are positioned either side of gate 180.

Drain region 140 includes a first doped zone 111 formed in semiconductor layer 104 and a second doped zone 112 also formed in thin semiconductor layer 104 and bracketed with first doped zone 111.

The doping of first zone 111 is high and of a given type, for example of the N+ type, whereas that of second doped zone 112 may be of a different type and at a lower concentration than that of the doping of first zone 111. Second zone 112 may thus be, for example, P doped.

A junction, in this example of the N+P type, is thus made in drain region 140 of the transistor.

First doped zone 111 is the zone in which a first contact 141 is made in order to polarise drain region 140 of the transistor.

There is a third doped zone 113 in source region 160 and it can be formed in semiconductor layer 104.

The doping of third zone 113 may be high and different from that of second doped zone 112. The doping of third zone 113 may be of the same type as that of first doped zone 111, for example a doping of N+ type. In this example embodiment, third doped zone 113 extends under a first insulating spacer 191 positioned against gate electrode 180, as far as a region located vertically or close to a contact zone between this insulating spacer 191 and gate electrode 180. Third doped zone 113 belonging to source region 160 and second doped zone 112 of drain region 140 are separated from one another by a zone 115 of conductive layer 104 which may be undoped or weakly doped, i.e. at a concentration less than $10^{17}$ $cm^{-3}$.

This zone 115 extends, in this example, from the region located vertically, or close to vertically, to the contact zone between first insulating spacer 191 and gate 180, as far as said second doped zone 112. Zone 115 extends under a second insulating spacer 192. The border between this zone 115 and second doped zone 112 may be located beyond second spacer 192, such that second spacer 192 rests fully on a portion 115a of undoped or weakly doped zone 115.

Compared to a tunnel transistor structure as illustrated in FIG. 1A or 1B, the transistor of FIG. 4 includes an additional N+ doped zone 111 on which contact 141 is produced. This additional zone enables a bipolar amplification of tunnel current to be implemented, resulting in a higher current at state $I_{ON}$ than in conventional tunnel-effect transistors, whilst having a subthreshold swing of less than 60 mV/decade in a higher drain current range.

The transistor may be biased, for example such that a potential $V_D<0$ V is applied to drain region 140 of the transistor, that a potential $V_G<0$ V is applied to its gate 180 and that a potential $V_S=0$ V is applied to its source region 160.

Holes generated by tunnel effect in the junction between N+ doped zone 113 of source region 160 and the undoped or weakly doped channel are directed to drain region 140. This increases the direct biasing of the N+P junction of drain region 140. This causes an additional injection of electrons (which are in this example of biasing the majority charge carriers) from first N+ doped zone 111 of drain region 140 to second P doped zone 112 of drain region 140, which are then directed to source region 160.

Such an architecture enables a bipolar amplification of the current generated by tunnel effect to be produced, and by this means enables a higher current to be obtained than with tunnel-effect transistors according to the prior art, notably of at least 1 mA/μm, whilst preserving, as in the tunnel-effect transistors according to the prior art, satisfactory properties of switching between its states (on or off).

A second example transistor structure is given in FIG. 5.

The architecture of drain region 140 differs from the one described above, notably in that first doped zone 111 is resting on and is in contact with second doped zone 112. Doped zones 111, 112 forming an N+P junction are thus stacked on semiconductor layer 104.

Such an architecture may be easier to implement than the previous one, and in particular may enable zones 111 and 112 to be made more easily from different semiconductor materials.

In this example embodiment, undoped or weakly doped zone 115 of semiconductor layer 104, located between second doped zone 112 and third doped zone 113 in the path of the charge carriers flowing between drain region 140 and source region 160, also extends this time under drain region 140. Second doped zone 112 may thus rest on and be in contact with a portion 115b of the undoped or weakly doped semiconductor zone.

A particular implementation provides for producing first doped zone 111 in a layer made of a first semiconductor material, for example such as Si, and second doped zone 112 in a layer made of a second semiconductor material, different from the first material, and preferably having a smaller gap, for example such as $Si_{1-x}Ge_x$.

Implementation of a first N+ doped zone 111 made of Si and of a second P doped zone 112 made of $Si_{1-x}Ge_x$ enables a high electron current to be obtained even when the conduction of holes generated by tunnel effect remains low.

With such an architecture the tunnel effect may be amplified whilst keeping satisfactory switching properties of the tunnel-effect junction.

Other combinations of semiconductor materials may be used to implement a transistor as described above in connection with FIGS. 4 and 5. Materials such as InGaAs, InGaP, of the AlGaAs and GaAs may in particular be used, with zone 112 having a smaller gap than zone 111.

A third example of a tunnel-effect transistor is given in FIG. 6.

Gate electrode 180 of this transistor is resting on a stack of semiconductor layers 108, 106, 104.

The device further includes a fourth zone 114 which is strongly doped with a doping of the same type as that of third doped zone 113, for example of the N+ type. Fourth doped zone 114 is in contact with third doped zone 113 and extends under and opposite source region 160, the channel region, and drain region 140. Fourth doped zone 114 may thus be an extension of source region 160 of the transistor, which is then qualified as a "buried" source.

Fourth doped zone 114 may be made, for example, in layer 104 of the SOI substrate. This fourth doped zone 114 may enable the flow of electrons between source region 160 and drain region 140 to be improved.

On semiconductor layer 104 rests a semiconductor layer 106 called a "buffer", in which third doped zone 113 is partially produced. Buffer semiconductor layer 106 includes an undoped or weakly doped zone which extends under gate electrode 180 and also under drain region 140.

On this buffer semiconductor layer 106 rests a semiconductor layer 108 called a "tunnel", in which third doped zone 113 is at least partially produced, and including an undoped or weakly doped zone which extends under gate electrode 180 and also under drain region 140. Tunnel semiconductor layer 108 may be made from a small-gap semiconductor material such as $Si_{1-x}Ge_x$ in order to increase the tunnel injection rate.

This tunnel semiconductor layer 108 may thus be made of the same semiconductor material as that of a layer in which second doped zone 112 of drain region 140 is made. Making semiconductor zone 180 layer of SiGe enables the tunnel effect to be facilitated.

As a variant, the examples of devices described above may be produced on a massive substrate commonly called a "bulk" substrate, for example made of Si, or again of a III-V semiconductor material.

A detailed example embodiment of a tunnel-effect transistor of the type described above will now be given.

Drain region 140 of this transistor includes a first zone 111 made of highly doped N+ silicon at a concentration higher than $10^{19}$ cm$^{-3}$ and with a thickness $e_5$ (where the thickness is a dimension measured in a direction parallel to vector $\vec{j}$ orthogonal marker [O; $\vec{i}$; $\vec{j}$; $\vec{k}$]) given in FIG. 6) of between 10 nm and 100 nm, for example of the order of 20 nm.

Under and in contact with first doped zone 111, drain region 140 includes a second zone 112 made of $Si_{1-x}Ge_x$, doped with a P type doping at a concentration of, for example, between $5\times10^{18}$ cm$^{-3}$ and $5\times10^{19}$ cm$^{-3}$ or, for example, of the order of $2\times10^{19}$ cm$^{-3}$. Such a concentration range enables a high bipolar amplification gain to be obtained.

Second doped zone 112, for its part, has a thickness $e_4$ of between, for example, 5 nm and 50 nm, for example of the order of 15 nm. A doped zone 112 present in such a thickness $e_4$ enables the amplification gain to be improved, whilst limiting the propagation times, and preventing effects commonly called "punch-through" effects. Germanium content x of second zone 112 may be between 0% and 70%, for example the order of 30%.

Gate electrode 180 has a length or critical dimension $L_G$ of between 10 nm and 1000 nm, for example of the order of 50 nm or of 25 nm, and rests on a gate oxide which may be, for example, formed from a layer of dielectric material of thickness, for example, of the order of 1 nm. The term critical dimension is understood to mean throughout the present description the smallest dimension of a zone or block excluding its thickness (where critical dimension $L_G$ is, in the example of FIG. 6, a dimension measured in a direction parallel to vector a of orthogonal marker [O; $\vec{i}$; $\vec{j}$; $\vec{k}$]).

Gate 180 of the transistor rests on an undoped or weakly doped intrinsic tunnel semiconductor layer 108, i.e. with an N type doping of concentration less than $10^{17}$ cm$^{-3}$, at a P type doping of concentration less than $10^{17}$ cm$^{-3}$.

Tunnel semiconductor layer 108 is made of $Si_{1-x}Ge_x$ and with a Ge content x of between 0% and 60%, for example of the order of 30%. This tunnel semiconductor layer 108 also has a thickness $e_3$ of between 5 nm and 50 nm, or for example of the order of 10 nm.

Tunnel semiconductor layer 108 rests on a buffer semiconductor layer 106 notably enabling a parasitic tunnel phenomenon between second doped zone 112 and a fourth doped zone 114 formed in a semiconductor layer on which buffer semiconductor layer 106 rests to be prevented, where fourth doped zone 114 is in contact with third doped zone 113, and is doped with a doping of the same type as that of third doped zone 113, for example an N+ doping.

Buffer semiconductor layer 106 has a thickness $e_2$ of between 10 nm and 100 nm, or for example of the order of 40 nm, and is made from an undoped or weakly doped intrinsic semiconductor material, i.e. with an N type doping of concentration of $10^{17}$ cm$^{-3}$ at a P type doping of concentration $10^{17}$ cm$^{-3}$.

Buffer semiconductor layer 106 rests on a semiconductor layer 104 in which fourth doped zone 114 is formed, and enables a path of low resistivity to be created for electrons flowing between drain region 140 and source region 160 of the transistor. This zone 114 may be highly N+ doped at a concentration higher than $10^{19}$ cm$^{-3}$ and enables a high on-state current to be obtained. Fourth doped zone 114 has a thickness $e_1$ of between 5 nm and 1000 nm, for example of the order of 20 nm, and forms a buried source region which extends against an undoped or weakly doped semiconductor zone 115 and third doped zone 113.

Third doped zone 113 includes a semiconductor region made of silicon resting on tunnel layer 108 having a thickness $e_6$ of between, for example, 10 nm and 100 nm, for example of the order of 35 nm.

Border 185 between this third doped zone 113 and the channel region may be offset relative to the border between insulating spacer 192 and gate 180. This offset is chosen such that a portion of third doped zone 113 is located opposite gate 180.

This protrusion may be, for example, of the order of 2 nm.

FIG. 7A represents a hole density within a tunnel-effect transistor as described above, for biasing conditions such that drain potential $V_D$=-1.5V, gate potential $V_G$=-1.5V, and source potential $V_S$=0V. This figure shows a stream of holes flowing from the channel zone to second doped zone 112 of the drain region and then first doped zone 111.

For its part, FIG. 7B represents an electron density within this transistor. Electrons flow from second doped zone 112 towards fourth buried source doped zone 114. These FIGS. 7A, 7B show that with such a transistor a high electron current may be obtained whilst maintaining a low hole current.

Other results of simulations of electrical performance of such a transistor obtained using a simulation tool, for example of the SENTAURUS type, are illustrated in FIGS. 8, 9, 10 and 11.

Figure 8:
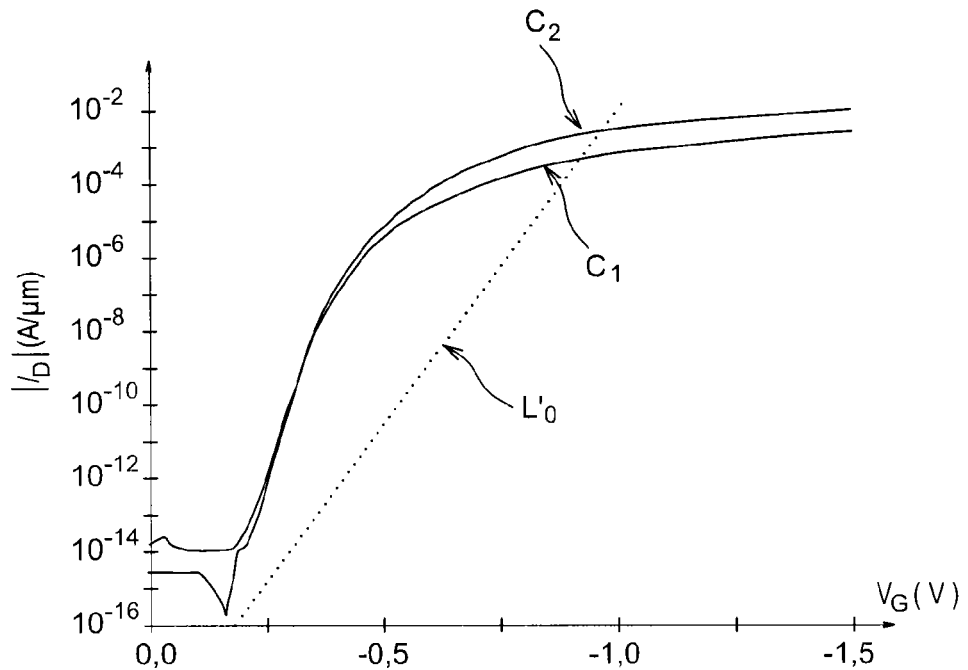

FIG. 8 gives curves $C_1$, $C_2$ of the change of drain current $I_D$ according to a gate potential of the transistor of the type of FIG. 5 having a gate length $L_G$ of 50 nm and including a tunnel layer 108 made of $Si_{0.7}Ge_{0.3}$, where the change of $I_D$ has a constant drain potential $V_D$, with $V_D$=-1V for first curve $C_1$ and $V_D$=-1.5V for second curve $C_2$. As a comparison, a threshold of 60 mV/dec of a parameter SS (Subthreshold Swing), with SS=$\partial V_{GS}/\partial I_D$ (where $V_{GS}$ is the voltage between the gate electrode and the source electrode) is represented (straight line $L'_0$).

A conduction current $I_{ON}$>$1\times10^{-3}$ A/μm at the on-state may be obtained for a gate potential $V_G$=-1.2V and a drain potential $V_D$=-1V.

Figure 9:
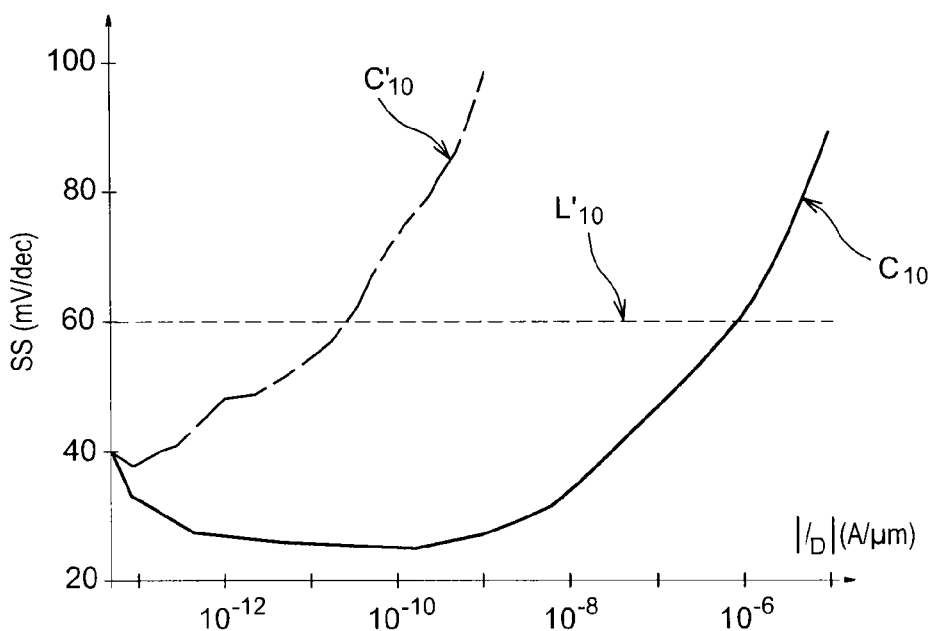

In FIG. 9, a curve $C_{10}$ representative of parameter SS (Subthreshold Swing) with SS=$\partial V_{GS}/\partial I_D$ (where $V_{GS}$ is the voltage between gate electrode and source electrode) according to drain current $I_D$ of the transistor for a potential $V_D$=-1V. A parameter SS of less than 60 mV/dec may thus be obtained for $I_D$ of between $10^{-13}$ A/μm and $10^{-6}$ A/μm, where this parameter SS may even attain values of less than 25 mV/dec.

As a comparison, a curve $C'_{10}$ representative of parameter SS for a TFET transistor according to the prior art is given. A straight line $L'_{10}$, for its part, represents threshold SS of 60 mV/dec.

Figure 10:
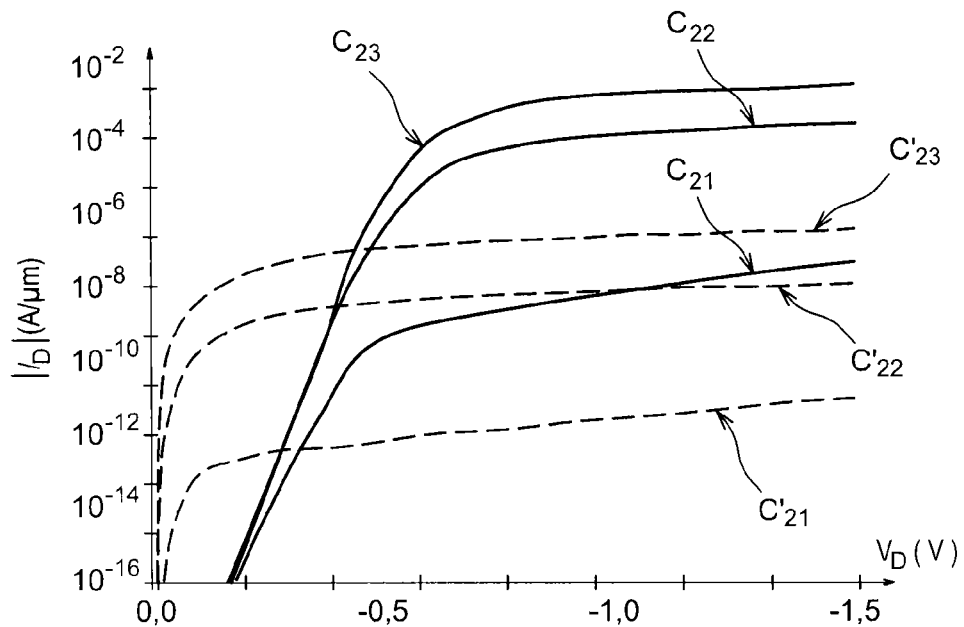

FIG. 10 gives curves $C_{21}$, $C_{22}$, $C_{23}$, (continuous lines) of the change of drain current according to a drain potential of the transistor with constant gate potential $V_G$, with $V_G=-0.5V$ for first curve $C_{21}$, $V_G=-1V$ for second curve $C_{22}$ and with $V_G=-1.5V$ for third curve $C_{23}$. As a comparison, curves $C'_{21}$, $C'_{22}$, $C'_{23}$, (dashed lines) of change of drain current of a TFET transistor according to the prior art, respectively for a gate potential of −0.5V, a gate potential of −1V, and a gate potential of −1.5V, are given.

To improve drain current $I_D$, second doped zone 112 may be doped more heavily, or a tunnel layer made of a III-V type semiconductor material may be positioned under the gate of the transistor.

The FIG. 11 gives curves $C_{31}$, $C_{32}$ representative of changes of drain current according to gate potential $V_G$ at constant drain potential and equal to −1.5V, respectively for a gate of length $L_G=25$ nm and a gate of length $L_G=50$ nm. These curves show that the performance in terms of drain current of the device is maintained, even with very small dimensions, in particular of gate length.

An example of a method of producing a transistor according to the invention, and of the type described above in connection with FIG. 6, will now be given (FIGS. 12A-12H).

The initial material of this method may be a substrate of the semiconductor on insulator type, formed from a semiconductor support (not represented), for example made of silicon, covered with an insulating layer 302, for example made of $SiO_2$, itself covered with a semiconductor layer 304, for example made of Si (FIG. 12A).

In semiconductor layer 304, isolation regions 305 are formed which can be of the STI (Shallow Trench Isolation) type, and formed using steps of photolithography, etching and oxidation. A proportion of the thickness of semiconductor layer 304 may then be removed in a zone located between isolation regions 305 (FIG. 12B).

A doping of layer 304, for example of the N+ type, is then undertaken to form a doped layer 314 of the buried source region. This doping may be accomplished, for example, by implantation using arsenic or phosphorus (FIG. 12C).

After this a buffer layer 306, for example made of Si, on which a tunnel semiconductor layer 308, for example made of $Si_{1-x}Ge_x$, is produced, is formed on N+ doped semiconductor layer 304. Semiconductor layers 306, 308 may be produced, for example, by epitaxy (FIG. 12D).

A gate stack is then formed, for example by ALD (Atomic Layer Deposition), or oxidation of the channel's semiconductor material, in order to produce a gate dielectric 317, followed by deposition of the PVD type (Physical Vapour Deposition) or CVD type (Chemical Vapour Deposition) of a gate material 317, for example formed from a stack of metal and polysilicon. These steps may be followed by steps of photolithography and etching so as to form a gate pattern (FIG. 12E).

Insulating spacers are then produced either side of the gate, for example by deposition followed by etching of a dielectric material 319, for example silicon nitride (FIG. 12F).

According to one possibility (not represented), the insulating spacers may be formed from a stack of several layers.

Source and drain regions are then formed.

This may be accomplished by formation of a P doped semiconductor zone, for example made of $Si_{1-x}Ge_x$, on one side of the gate of the transistor, followed by formation of another N+ doped semiconductor zone, for example made of silicon, either side of the gate of the transistor, where the N+ doped zone covers the P doped zone on the side of the drain region.

According to one variant (FIG. 12G) using fewer steps, a P doped semiconductor layer 322, for example made of $Si_{1-x}Ge_x$, is first formed on tunnel layer 308 either side of gate 318 of the transistor, and another N+ doped semiconductor layer 324 is then formed on this P doped semiconductor layer 322 (FIG. 12G).

A localised doping is then accomplished (FIG. 12H), in particular a localised implantation, on a single side of the gate, where the implanted side is that of the source region of the transistor, in order to transform P doped semiconductor layer 322 made of $Si_{1-x}Ge_x$ into an N+ doped zone on the source region side.

During this implantation step an N+ doping of a zone 326 of tunnel layer 308 and of a zone 327 of buffer layer 306 located on the side of the source region is also undertaken. The method which has just been described may equally be adapted to a substrate other than an SOI substrate, for example to a bulk Si substrate or to a semiconductor substrate made of III-V material.

A fourth example of a transistor according to the invention is illustrated in FIG. 13 and includes superposed drain, channel and gate regions.

Drain region 440 includes a first doped zone 411 doped with a doping of a first type, for example of type N+, surmounted by a second zone 412 doped with a doping of a second type, different from the first type, for example of type P. First N+ doped zone 411 may advantageously be formed from a semiconductor layer, for example made of silicon, whereas second doped zone 412 is formed from another semiconductor layer, for example made of $Si_{1-x}Ge_x$, on and in contact with the Si layer.

First doped zone 411 and second doped zone form in this manner an N+P junction surmounted by a buffer semiconductor layer 408 in which there is a channel region of the transistor, and on which a gate dielectric and a gate electrode 480 rest.

Either side of gate 480, zones 413 and 414, doped with doping of the same type as that of first zone 411, for example an N+ doping, form a source region positioned either side of gate 480. These doped zones 413, 414 extend under spacers 491, 492 formed against gate 480 and may be separated from one another by a weakly doped or undoped semiconductor region 415 which may belong to semiconductor layer 408.

Length R or critical dimension R (where R is, in this example, a dimension measured in a direction parallel to vector $\vec{i}$ of orthogonal marker [O; $\vec{i}$; $\vec{j}$; $\vec{k}$] given in FIG. 11) of region 415 of layer 408 separating these doped zones 413 and 414 may be, for example, between 20 nm and 1 micron, for example of the order of 50 nm.

Buffer layer 408 in contact with a second doped zone 412 is for example made of silicon, whereas doped zones 413 and 414 are for example made of SiGe.

Biasing conditions such that a source potential $V_S=0V$ is applied to doped zones 413 and 414, that a potential $V_G$ less than 0V is applied to gate 480, and that a drain potential $V_D$ less than 0V is applied to N+ doped zone 411, may for example be provided.

Such a transistor may have a current $I_{ON}$ in the on-state greater than $1\times10^{-3}$ A/μm for a gate potential |VG|=1.2 V and a drain potential |VD|=1V.

FIG. 14 illustrates the electrical performance of such a transistor, designed with doped zones 413 and 414 spaced by a length R of 50 nm.

In this figure, curves $C_{41}$, $C_{42}$ are representative of parameter SS of this transistor for a drain potential $V_D=-1V$, and for a drain potential $V_D=-1.5V$. A line $L'_{40}$ marks a limit of 60 mV/dec of parameter SS, the reverse of the characteristic subthreshold swing for a standard transistor.

With a transistor such as the one implemented in FIG. 13, a parameter SS less than 60 mV/dec may be obtained for a large drain current range, and in particular larger than for a tunnel transistor of the prior art.

FIG. 15A represents a hole density within a tunnel-effect transistor as described above, for biasing conditions such that drain potential $V_D=-1.5V$, gate potential $V_G=-2V$, and source potential $V_S=0V$.

For its part, FIG. 15B represents an electron density within this transistor.

FIG. 16 illustrates a fifth transistor example, in which drain region 540, the channel region and source region 560 are superposed. Drain region 540 forms an N+P junction, on which an undoped or weakly doped zone 515 is positioned, where this undoped or weakly doped zone 515 is surmounted by source region 560.

Source region 560 of this transistor is formed of a doped zone 513 doped with a doping of the first type, for example of the N+ type, formed in a semiconductor layer 509, for example made of Si, and rests on a tunnel semiconductor block 508, for example made of $Si_{1-x}Ge_x$. Doped zone 513 is extended in the upper portion of tunnel semiconductor block 508 which is also N+ doped, where the lower portion of tunnel semiconductor block 508, for its part, is undoped or weakly doped.

A gate electrode 580 is formed around or either side of tunnel semiconductor block 508 against side walls of this block, which rests on another undoped semiconductor block 510, for example made of Si, surrounded by insulator blocks 551, 552, for example made of $Si_3N_4$.

In this example, a portion of the gate is located opposite a portion of doped zone 513 located in the upper portion of semiconductor block 508. This positioning of the gate opposite N+ zone 560 enables the electric field to be maximised, enabling the tunnel effect to be increased.

Semiconductor blocks 508, 510 may have a length $R_2$ or critical dimension $R_2$ (where $R_2$ is in this case a dimension measured in a direction parallel to vector $\vec{i}$ of orthogonal marker $[O; \vec{i}; \vec{j}; \vec{k}]$ given in FIG. 16), for example of between 20 nm and 1 micron or of the order of 50 nm.

Undoped semiconductor block 510 and insulating blocks 551, 552 formed either side of the latter rest on a semiconductor zone 512 doped with a doping of a type different from that of zone 513, for example a P type doping Second doped zone 512 rests on another doped zone 511, forming a junction with the latter. This other doped zone 511 may be N+ doped, and for example made of Si.

Biasing conditions such that a source potential $V_S=0V$ is applied, a potential $V_G$ less than 0V is applied to gate 580, and that a drain potential $V_D$ less than 0V is applied to N+ doped zone 511, may for example be provided.

FIG. 17 illustrates electrical performance of such a transistor. In this figure, curves $C_{51}$, $C_{52}$ are representative of drain current $I_D$ according to potential $V_G$ applied to the gate, respectively for a drain potential $V_D=-1V$, and for a drain potential $V_D=-1.5V$. A line $L'_{50}$ marks a limit of 60 mV/dec.

FIG. 18A represents a hole density within a tunnel-effect transistor as described above in connection with FIG. 16, for biasing conditions with a drain potential $V_D=-1.5V$, a gate potential $V_G=-2V$, and a source potential $V_S=0V$.

For its part, FIG. 18B represents an electron density within this transistor.

FIG. 19 illustrates a sixth example of a tunnel transistor with bipolar amplification implemented according to the invention.

This transistor differs from the previously described example, in that it includes a first gate electrode 581, and a second gate electrode 582, where these gate electrodes are independent and are not connected to one another.

Gate electrodes 581, 582 are positioned either side of tunnel semiconductor block 508 against side walls of this block, and may thus be biased independently of one another. In this example, a portion of gates 581, 582 is located opposite a portion of doped zone 513 located in the upper portion of semiconductor block 508. This positioning opposite N+ zone 560 enables the electric field to be maximised, enabling the tunnel effect to be increased.

First gate electrode 581 may be biased with a potential $V_{G1}>0$ V in order to improve the vertical electron flow, whereas second gate electrode 582 may be biased with a potential $V_{G2}<0$ V to increase the tunnel effect.

Such an architecture with two independent gates, i.e. gates which may be biased independently of one another, may advantageously enable a transistor to be implemented in which length $R_2$, also called critical dimension $R_2$, of semiconductor block 510 up to a value for example of the order of 10 nm.

FIG. 20, for its part, represents an electron density within such a transistor when first gate electrode 581 is biased at a potential $V_{G1}$ such that $V_{G1}=1.5V$, and when second gate electrode 582 is biased at a potential $V_{G2}$ such that gate $V_{G2}=-1.5V$.

The invention claimed is:

1. A tunnel-effect transistor comprising:
a source region, a drain region and a gate electrode, a first region among said source and drain regions including a first doped zone with a doping of a first type, said first region including a second doped zone with a doping exclusively of a second type and forming a junction with said first doped zone, wherein a second region, among the source and drain regions, further includes a third doped zone with a doping of the first type,
wherein
said second doped zone and said third doped zone are separated by, and both in contact with, a semiconductor zone,
the second doped zone extends in between the first doped zone and the semiconductor zone,
a channel region is provided in said semiconductor zone, and
said first doped zone contacts said second doped zone while not contacting with said semiconductor zone.

2. The tunnel-effect transistor according to claim 1, wherein said first doped zone and said second doped zone are superposed or stacked.

3. The tunnel-effect transistor according to claim 1, further including: a first insulating spacer and a second insulating spacer positioned against the gate electrode, where the third doped zone extends under the second spacer, wherein said semiconductor zone is in contact with said second doped zone, and positioned opposite the gate and under the first spacer.

4. The tunnel-effect transistor according to claim 3, in which said second region, among the source and drain regions, including a fourth doped zone having a doping of a type different from that of said second zone and of the same type as that of the third doped zone, where the fourth doped zone is in contact with the third doped zone, and positioned opposite said channel region and said first region, wherein said semiconductor zone separates said fourth doped zone from said second doped zone.

5. The tunnel-effect transistor according to claim 3, wherein the first doped zone and the second doped zone are superposed, the drain region and source region further being superposed, wherein said second region includes, on either side of the gate electrode, the third doped zone and a fourth zone doped with a doping of the same type as that of said third doped zone, the fourth doped zone and said third doped zone resting on said semiconductor zone, and being separated from the second doped zone by said semiconductor zone.

6. The tunnel-effect transistor according to claim 3, wherein the first doped zone and the second doped zone are superposed, the drain region and source region further being superposed, where an undoped semiconductor zone rests on said second doped zone, and separates said second doped zone from said third doped zone, where said third doped zone rests on the undoped semiconductor zone, and where the gate electrode is positioned around a portion of said undoped semiconductor zone.

7. The tunnel-effect transistor according to claim 3, wherein the first doped zone and the second doped zone are superposed, the drain region and source region further being superposed, where an undoped semiconductor zone rests on said second doped zone, and separates said second doped zone from said third doped zone, where said third doped zone rests on the undoped semiconductor zone,
 where said gate electrode is positioned against a first portion of said undoped or weakly doped semiconductor zone, wherein the transistor further includes another gate electrode independent from said gate electrode and which is positioned against another portion of said undoped semiconductor zone, opposite said first portion.

8. The tunnel-effect transistor according to claim 1, in which the first doped zone is made from a first semiconductor material, and in which the second doped zone is made from a second semiconductor material, where the second semiconductor material has a smaller gap than the first semiconductor material.

9. The tunnel-effect transistor according to claim 5, in which the first doped zone is made from a first semiconductor material, and in which the second doped zone is made from a second semiconductor material, where the second semiconductor material has a smaller gap than the first semiconductor material.

10. The tunnel-effect transistor according to claim 6, in which the first doped zone is made from a first semiconductor material, and in which the second doped zone is made from a second semiconductor material, where the second semiconductor material has a smaller gap than the first semiconductor material.

11. The tunnel-effect transistor according to claim 7, in which the first doped zone is made from a first semiconductor material, and in which the second doped zone is made from a second semiconductor material, where the second semiconductor material has a smaller gap than the first semiconductor material.

12. The tunnel-effect transistor according to claim 8, in which the gate and the second doped zone rest on a layer made of the second semiconductor material.

13. A microelectronic device including one or more of the tunnel-effect transistors according to claim 1.

14. The tunnel-effect transistor of claim 1, wherein said semiconductor zone comprises an undoped semiconductor zone.

15. The tunnel-effect transistor of claim 1, wherein said semiconductor zone comprises a weakly doped semiconductor zone.

16. The tunnel-effect transistor of claim 1, wherein said semiconductor zone comprises a doping of $10^{17}$ cm$^{-3}$ or less.

17. A tunnel-effect transistor comprising:
 a source region, a drain region and a gate electrode, a first region among said source and drain regions including a first doped zone with a doping of a first type, said first region including a second doped zone with a doping exclusively of a second type and forming a junction with said first doped zone, wherein a second region, among the source and drain regions, further includes a third doped zone with a doping of the first type; and
 a semiconductor zone under the gate electrode, having a channel region therein,
 wherein
 the second doped zone extends in between the first doped zone and the semiconductor zone, and
 said second doped zone is interposed between the first doped zone and the semiconductor zone having a channel region therein.

18. A tunnel-effect transistor comprising:
 a source region, a drain region and a gate electrode, a first region among said source and drain regions including a first doped zone doped with a doping of a first type, said first region including a second doped zone doped with a doping of a second type and forming a junction with said first doped zone, wherein a second region, among the source and drain regions, further includes a third doped zone doped with a doping of the first type,
 wherein
 said second doped zone and said third doped zone are separated by, and both in contact with, a non-doped or a weakly doped semiconductor zone, said non-doped or a weakly doped semiconductor zone having a concentration of dopants of $10^{17}$ cm$^{-3}$,
 the second doped zone extends in between the first doped zone and the non-doped or weakly doped semiconductor zone,
 a channel region is provided in said semiconductor zone, and
 said first doped zone contacts said second doped zone while not contacting with said semiconductor zone,
 the transistor further including: a first insulating spacer and a second insulating spacer positioned against the gate electrode, wherein said non-doped or weakly-doped semiconductor zone is in contact with said second doped zone, said non-doped or weakly-doped semiconductor zone extending under the first insulating spacer.

* * * * *